(12) United States Patent
Stoyanov et al.

(10) Patent No.: US 11,619,237 B2
(45) Date of Patent: Apr. 4, 2023

(54) CARBON SEAL ASSEMBLY

(71) Applicant: United Technologies Corporation, Farmington, CT (US)

(72) Inventors: Pantcho P. Stoyanov, West Hartford, CT (US); Jonathan F. Zimmitti, Glastonbury, CT (US); Nasr A. Shuaib, Watertown, MA (US)

(73) Assignee: Raytheon Technologies Corporation, Farmington, CT (US)

( * ) Notice: Subject to any disclaimer, the term of this patent is extended or adjusted under 35 U.S.C. 154(b) by 338 days.

(21) Appl. No.: 16/791,298

(22) Filed: Feb. 14, 2020

(65) Prior Publication Data

US 2021/0254628 A1    Aug. 19, 2021

(51) Int. Cl.
| | |
|---|---|
| *F16J 15/34* | (2006.01) |
| *F04D 29/12* | (2006.01) |
| *C23C 16/27* | (2006.01) |
| *C23C 16/32* | (2006.01) |
| *C23C 28/04* | (2006.01) |

(52) U.S. Cl.
CPC ............ *F04D 29/12* (2013.01); *F16J 15/348* (2013.01); *C23C 16/27* (2013.01); *C23C 16/32* (2013.01); *C23C 28/046* (2013.01); *F05C 2203/0808* (2013.01); *F05C 2203/0813* (2013.01)

(58) Field of Classification Search
CPC ....... C23C 16/27; C23C 16/32; C23C 28/046; F04D 29/12; F05D 2203/0808; F05D 2203/0813; F16J 15/348; F16J 15/54
See application file for complete search history.

(56) References Cited

U.S. PATENT DOCUMENTS

| | | | |
|---|---|---|---|
| 2,956,694 A | 10/1960 | Theodore | |
| 7,234,541 B2 * | 6/2007 | Scott | ................. F16J 15/3496 175/57 |
| 10,480,657 B1 | 11/2019 | Yandle, II et al. | |
| 2009/0060408 A1 * | 3/2009 | Nagasaka | ............ F16J 15/3496 384/625 |
| 2010/0061676 A1 | 3/2010 | Sugiyama | |
| 2013/0016937 A1 | 1/2013 | Tsutsui et al. | |
| 2014/0117627 A1 * | 5/2014 | Franke | ..................... F16J 15/26 277/500 |
| 2014/0265151 A1 | 9/2014 | Vasagar | |
| 2015/0345642 A1 | 12/2015 | Haas et al. | |
| 2015/0353856 A1 | 12/2015 | Kleyman et al. | |

FOREIGN PATENT DOCUMENTS

| | | |
|---|---|---|
| EP | 3263842 | 1/2018 |
| EP | 3626694 | 3/2020 |
| JP | 2006266285 | 10/2006 |
| WO | 2012079727 | 6/2012 |

OTHER PUBLICATIONS

The Extended EP Search Report for EP Application No. 21156831.6 dated May 10, 2021.

\* cited by examiner

*Primary Examiner* — Gilbert Y Lee
(74) *Attorney, Agent, or Firm* — Carlson, Gaskey & Olds, P.C.

(57) ABSTRACT

A seal assembly includes a housing at least partially defining a seal opening and at least partially surrounding a rotatable shaft. A carbon seal is located at least partially in the seal opening and includes a sealing surface. The rotatable shaft includes a radially facing surface that has a carbide based coating and a diamond-like carbon coating in engagement with the sealing surface on the carbon seal.

20 Claims, 2 Drawing Sheets

CARBON SEAL ASSEMBLY

BACKGROUND

The present disclosure relates to seals and, more particularly, to carbon seals used in gas turbine engines.

A gas turbine engine typically includes a fan section, a compressor section, a combustor section, and a turbine section. Air entering the compressor section is compressed and delivered into the combustor section where it is mixed with fuel and ignited to generate a high-speed exhaust gas flow. The high-speed exhaust gas flow expands through the turbine section to drive the compressor and the fan section.

In one example, circumferential carbon seals are used in bearing compartments of gas turbine engines to provide a seal between oil used to lubricate parts of the gas turbine engine and other parts of the gas turbine engine. Bearing assemblies may also support a rotating shaft of the gas turbine engine. The circumferential carbon seals may be sealed against a seal carrier or housing against rotating seal components of the gas turbine engine.

SUMMARY

In one exemplary embodiment, a seal assembly includes a housing at least partially defining a seal opening and at least partially surrounding a rotatable shaft. A carbon seal is located at least partially in the seal opening and includes a sealing surface. The rotatable shaft includes a radially facing surface that has a carbide based coating and a diamond-like carbon coating in engagement with the sealing surface on the carbon seal.

In a further embodiment of any of the above, the carbide based coating is in direct contact with a radially outer surface of the rotatable shaft.

In a further embodiment of any of the above, the diamond-like carbon coating is in direct contact with the carbide based coating and the carbon seal.

In a further embodiment of any of the above, the housing forms a circumferential ring.

In a further embodiment of any of the above, the carbide based coating and the diamond-like carbon coating extend circumferentially around the rotatable shaft.

In a further embodiment of any of the above, the carbide based coating and the diamond-like carbon coating create a radial separation between the rotatable shaft and the carbon seal.

In a further embodiment of any of the above, the carbon seal includes a, electrocarbon grade carbon.

In a further embodiment of any of the above, the diamond-like carbon coating is silicon doped.

In a further embodiment of any of the above, the carbide based coating and the diamond-like carbon coating separate the rotatable shaft from contacting the carbon seal.

In a further embodiment of any of the above, a recess is in the rotatable shaft for accepting the carbide based coating and the diamond-like carbon coating.

In a further embodiment of any of the above, the carbon seal includes a first axial dimension and the radially inner contact surface includes a second axial dimension less than the first axial dimension.

In a further embodiment of any of the above, the radially inner contact surface is located on a radially inner side of a projection of the carbon seal.

In a further embodiment of any of the above, the carbide based coating is between 76 and 152 micrometers thick.

In a further embodiment of any of the above, the diamond-like carbon coating is approximately 1 micrometer thick.

In another exemplary embodiment, a method of using a seal assembly includes locating a carbon seal adjacent a rotatable shaft and separating the carbon seal from the rotatable shaft with a carbide based coating and a diamond-like carbon coating. A lubricant is generated between the carbon seal and the diamond-like carbon coating.

In a further embodiment of any of the above, the carbide based coating is in direct contact with the rotatable shaft. The diamond-like carbon coating is at least partially spaced from the rotatable shaft by the carbide based coating. The carbide based coating includes at least one of tungsten carbide-cobalt or chromium carbide.

In a further embodiment of any of the above, generating the lubricant includes forming a graphitic material between the interface of the carbon seal and the diamond-like carbon coating.

In a further embodiment of any of the above, a shaft is rotated adjacent the carbon seal. The shaft includes a velocity of at least 152 m/s relative to the carbon seal.

In a further embodiment of any of the above, the carbide based coating is applied through at least one of a high velocity oxygen fuel coating process or an APS coating process.

In a further embodiment of any of the above, the diamond-like carbon is applied through at least one of a PVD or CVD process.

BRIEF DESCRIPTION OF THE DRAWINGS

The various features and advantages of the present disclosure will become apparent to those skilled in the art from the following detailed description. The drawings that accompany the detailed description can be briefly described as follows.

DETAILED DESCRIPTION

Figure 1:
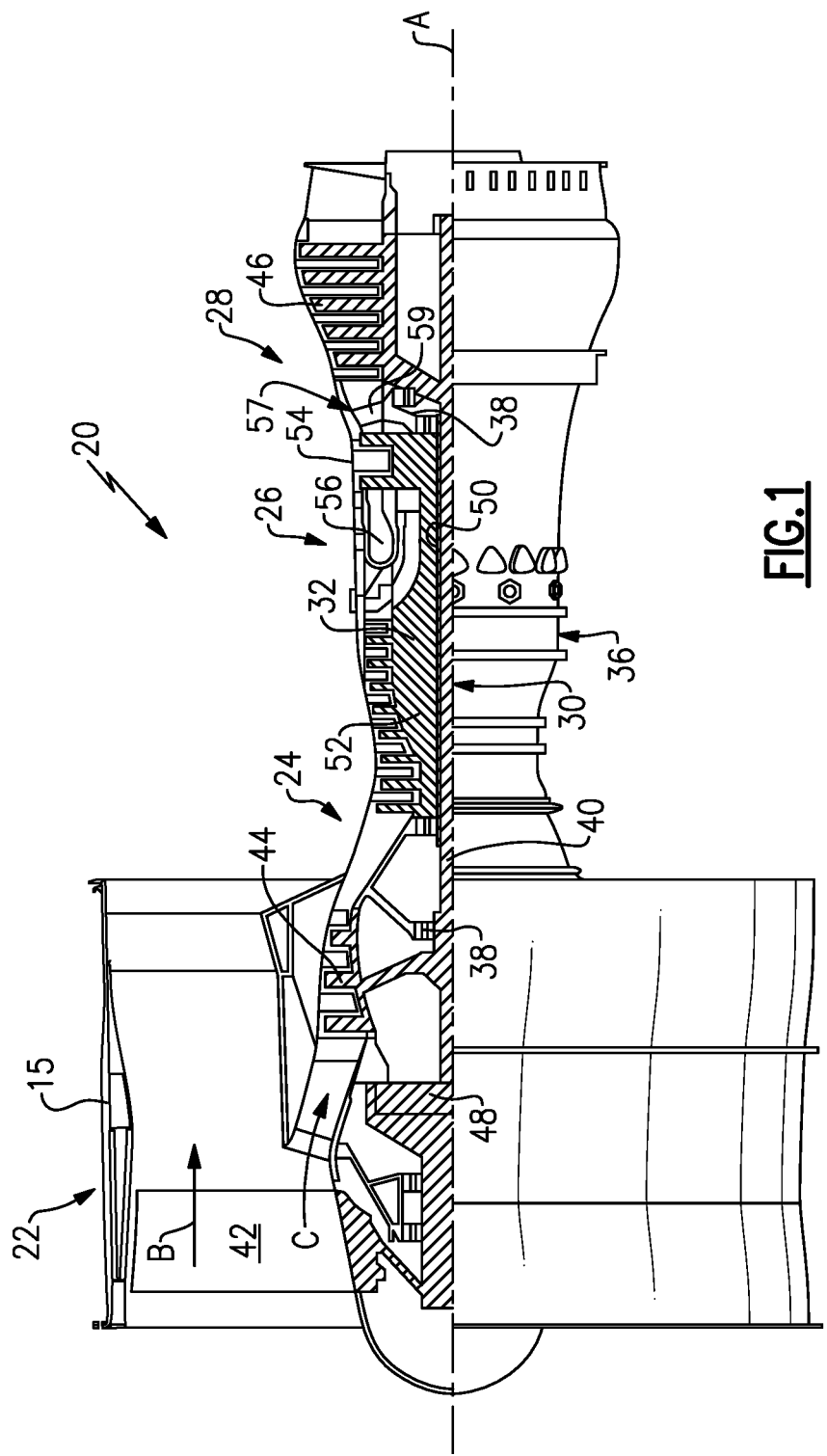
FIG. 1 is a schematic view of a non-limiting example of a gas turbine engine.

FIG. 1 schematically illustrates a gas turbine engine 20. The gas turbine engine 20 is disclosed herein as a two-spool turbofan that generally incorporates a fan section 22, a compressor section 24, a combustor section 26 and a turbine section 28. The fan section 22 drives air along a bypass flow path B in a bypass duct defined within a housing 15, such as a fan case or nacelle, and also drives air along a core flow path C for compression and communication into the combustor section 26 then expansion through the turbine section 28. Although depicted as a two-spool turbofan gas turbine engine in the disclosed non-limiting embodiment, it should be understood that the concepts described herein are not limited to use with two-spool turbofans as the teachings may be applied to other types of turbine engines including three-spool architectures.

The exemplary engine 20 generally includes a low speed spool 30 and a high speed spool 32 mounted for rotation about an engine central longitudinal axis A relative to an engine static structure 36 via several bearing systems 38. It should be understood that various bearing systems 38 at various locations may alternatively or additionally be provided, and the location of bearing systems 38 may be varied as appropriate to the application.

The low speed spool 30 generally includes an inner shaft 40 that interconnects, a first (or low) pressure compressor 44 and a first (or low) pressure turbine 46. The inner shaft 40 is connected to the fan 42 through a speed change mechanism, which in exemplary gas turbine engine 20 is illustrated as a geared architecture 48 to drive a fan 42 at a lower speed than the low speed spool 30. The high speed spool 32 includes an outer shaft 50 that interconnects a second (or high) pressure compressor 52 and a second (or high) pressure turbine 54. A combustor 56 is arranged in exemplary gas turbine 20 between the high pressure compressor 52 and the high pressure turbine 54. A mid-turbine frame 57 of the engine static structure 36 may be arranged generally between the high pressure turbine 54 and the low pressure turbine 46. The mid-turbine frame 57 further supports bearing systems 38 in the turbine section 28. The inner shaft 40 and the outer shaft 50 are concentric and rotate via bearing systems 38 about the engine central longitudinal axis A which is collinear with their longitudinal axes.

The core airflow is compressed by the low pressure compressor 44 then the high pressure compressor 52, mixed and burned with fuel in the combustor 56, then expanded over the high pressure turbine 54 and low pressure turbine 46. The mid-turbine frame 57 includes airfoils 59 which are in the core airflow path C. The turbines 46, 54 rotationally drive the respective low speed spool 30 and high speed spool 32 in response to the expansion. It will be appreciated that each of the positions of the fan section 22, compressor section 24, combustor section 26, turbine section 28, and fan drive gear system 48 may be varied. For example, gear system 48 may be located aft of the low pressure compressor, or aft of the combustor section 26 or even aft of turbine section 28, and fan 42 may be positioned forward or aft of the location of gear system 48.

The engine 20 in one example is a high-bypass geared aircraft engine. In a further example, the engine 20 bypass ratio is greater than about six (6), with an example embodiment being greater than about ten (10), the geared architecture 48 is an epicyclic gear train, such as a planetary gear system or other gear system, with a gear reduction ratio of greater than about 2.3 and the low pressure turbine 46 has a pressure ratio that is greater than about five. In one disclosed embodiment, the engine 20 bypass ratio is greater than about ten (10:1), the fan diameter is significantly larger than that of the low pressure compressor 44, and the low pressure turbine 46 has a pressure ratio that is greater than about five 5:1. Low pressure turbine 46 pressure ratio is pressure measured prior to inlet of low pressure turbine 46 as related to the pressure at the outlet of the low pressure turbine 46 prior to an exhaust nozzle. The geared architecture 48 may be an epicycle gear train, such as a planetary gear system or other gear system, with a gear reduction ratio of greater than about 2.3:1 and less than about 5:1. It should be understood, however, that the above parameters are only exemplary of one embodiment of a geared architecture engine and that the present disclosure is applicable to other gas turbine engines including direct drive turbofans.

A significant amount of thrust is provided by the bypass flow B due to the high bypass ratio. The fan section 22 of the engine 20 is designed for a particular flight condition—typically cruise at about 0.8 Mach and about 35,000 feet (10,668 meters). The flight condition of 0.8 Mach and 35,000 ft (10,668 meters), with the engine at its best fuel consumption—also known as "bucket cruise Thrust Specific Fuel Consumption ('TSFC')"—is the industry standard parameter of lbm of fuel being burned divided by lbf of thrust the engine produces at that minimum point. "Low fan pressure ratio" is the pressure ratio across the fan blade alone, without a Fan Exit Guide Vane ("FEGV") system. The low fan pressure ratio as disclosed herein according to one non-limiting embodiment is less than about 1.45. "Low corrected fan tip speed" is the actual fan tip speed in ft/sec divided by an industry standard temperature correction of $[(Tram\ °\ R)/(518.7°\ R)]^{0.5}$. The "Low corrected fan tip speed" as disclosed herein according to one non-limiting embodiment is less than about 1150 ft/second (350.5 meters/second).

Figure 2:
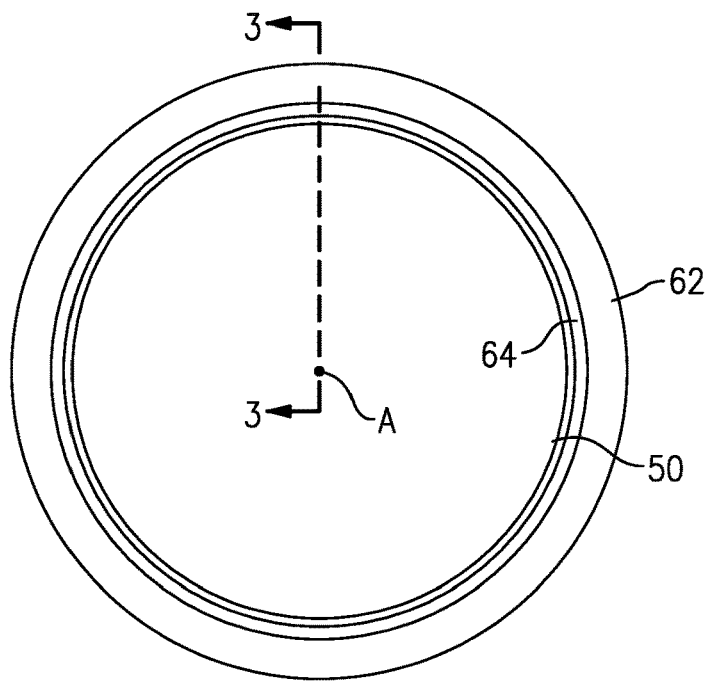
FIG. 2 illustrates an axial view of a shaft and a carbon seal assembly.
Figure 3:
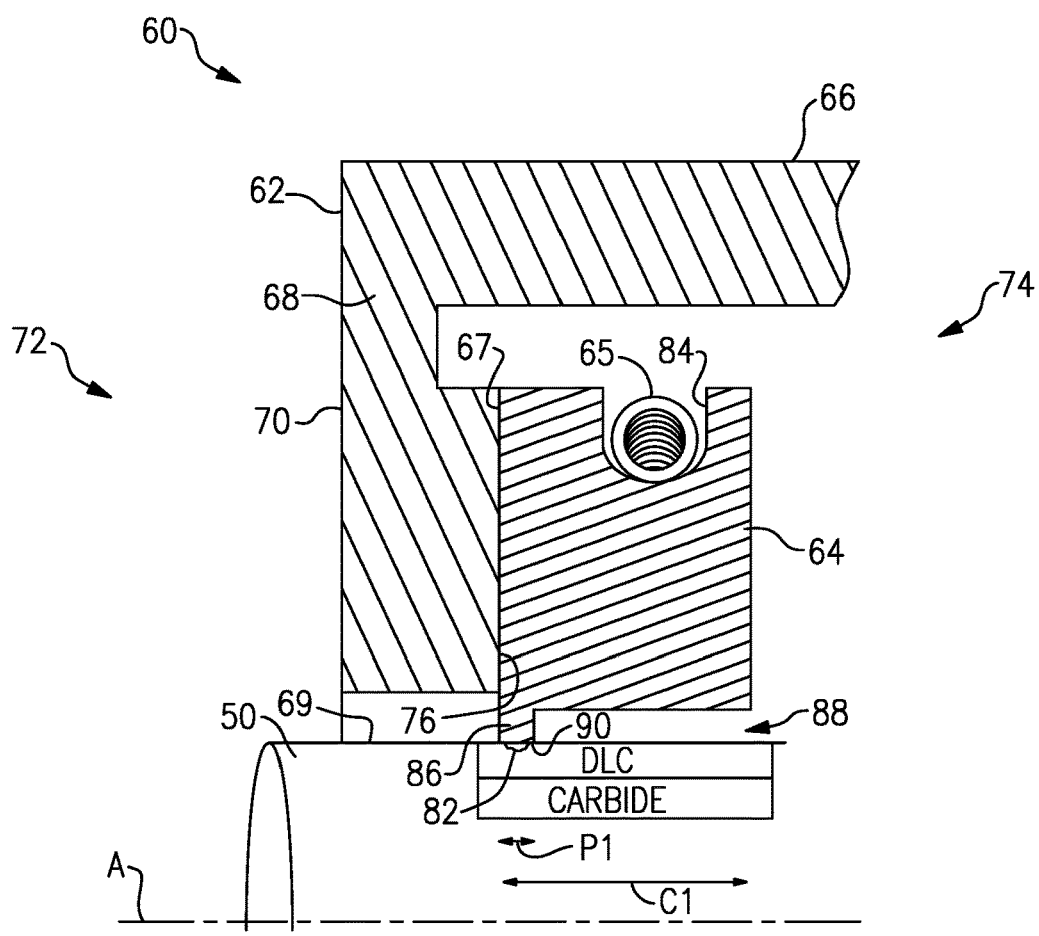
FIG. 3 illustrates a cross-sectional view taken along line 3-3 of FIG. 2.

As shown in FIGS. 2 and 3, a carbon seal assembly 60 completely surrounds the outer shaft 50. However, the carbon seal assembly 60 could be located around other shafts in the gas turbine engine 20, such as the inner shaft 40 or shafts within the geared architecture 48. The carbon seal assembly 60 at least includes a carrier or housing 62 that at least partially enclosing a carbon seal 64.

In the illustrated example, the housing 62 and the carbon seal 64 each form a single continuous ring. However, in another example, the housing 62 and the carbon seal 64 include multiple circumferential segments jointed together to form a ring with joints or discontinuities. The carbon seal 64 can be comprised of a suitable electrocarbon, such as an electrographitic grade carbon, salt impregnated carbon-graphite, resin impregnated carbon-graphite, non-impregnated carbon graphite, salt impregnated electrographite, non-impregnated electrographite either entirely or partially.

As shown in FIG. 3, the housing 62 includes an axially extending portion 66 and a radially extending portion 68 that each form a ring. In the illustrated example, the radially extending portion 68 extends radially inward from an axially forward end of the axially extending portion 66 such that a radially inner end of the radially extending portion 68 is a free end and spaced from the outer shaft 50. In this disclosure, radial or radially and axial or axially is in relation to the central longitudinal axis A and upstream or downstream is in relation to a flow of air through the gas turbine engine 20. Additionally, the fan section 22 is located adjacent an axially forward or upstream end of the gas turbine engine 20 and the turbine section 28 is located adjacent an axially aft or downstream end of the gas turbine engine 20.

The radially extending portion 68 includes an axially forward surface 70 at least partially defining an oil retaining portion 72 that is separated from an air portion 74 on an opposite side of the carbon seal assembly 60. An axially aft surface 76 is located on an opposite side of the radially extending portion 68 from the axially forward surface 70. The axially aft surface 76 directly contacts an axially forward surface 67 on the carbon seal.

The carbon seal 64 is biased radially inward towards the outer shaft 50 with a garter spring 65 when the carbon seal 64 is segmented. The garter spring 65 is located in a groove 84 in a radially outer surface of the carbon seal 64 and surrounds the carbon seal 64 to apply a compressive force to the carbon seal 64. One feature of the garter spring 65 is a reduction in leakage between the carbon seal 64 and the outer shaft 50 due to the compressive force applied. The outer shaft 50 can include a velocity relative to the carbon seal 64 of at least 152 m/s (approximately 500 ft/s) or at least 183 m/s (approximately 600 ft/s).

In the illustrated example, the carbon seal 64 includes a projection 86 adjacent the outer shaft 50 having a shaft contacting surface 90. The projection 86 forms a clearance gap 88 between the carbon seal 64 and the outer shaft 50. The clearance gap 88 results from the projection 86 having a smaller axial dimension than the carbon seal 64. In the illustrated example, the projection 86 includes an axial dimension P1 extending from an axially forward most edge to an axially aft most edge of the shaft contacting surface 90. The carbon seal 64 includes an axial dimension C1 that is greater than the axial dimension P1. In the illustrated example, the axial dimension P1 is less than 25% of the axial dimension C1. In another example, the axial dimension P1 is less than 50% of the axial dimension C1.

In the illustrated example, the outer shaft 50 is spaced from the carbon seal 64 by a carbide based coating 78, such as tungsten carbide-cobalt or chromium carbide, and a diamond-like carbon ("DLC") coating 80. The carbide based coating 78 directly contacts the radially outer surface 69 on the outer shaft 50. The diamond-like carbon coating 80 covers the carbide based coating 78 and is at least partially spaced form the radially outer surface 69 by the carbide based coating 78. Alternatively, the radially outer surface 69 on the outer shaft 50 includes a recess for accepting the carbide based coating 78 and the diamond-like carbon coating 80.

Therefore, the carbon seal 64 is spaced from and not in contact with the outer shaft 50 due at least in part to the carbide based coating 78 and the diamond-like carbon coating 80. Both the carbide based coating 78 and the diamond-like carbon coating 80 extend circumferentially around the outer shaft 50 to form a complete ring of separation between the outer shaft 50 and the carbon seal 64.

In the illustrated example, the carbide based coating 78 is applied directly to the radially outer surface 69 on the outer shaft 50 through one of a high velocity oxygen fuel coating process or an APS coating process. The diamond-like carbon coating 80 is spaced from the radially outer surface 69 by the carbide based coating 78 and is applied through one of a physical vapor deposition ("PVD") or a chemical vapor deposition ("CVD") process. In the illustrated example, the thicknesses of the carbide based coating 78 and the diamond-like carbon coating 80 are for illustrative purposes only and are not to scale. For example, the carbide based coating 78 can have a thickness of between 76 and 152 micrometers (3-6 thousandths of an inch) and the diamond-like carbon coating 80 is approximately 1 micrometer (0.04 thousandths of an inch).

The diamond-like carbon coating 80 is a thin film formed from a DLC material having sp2 and sp3 content. The sp2 content is indicative of graphitic content of the material, while the sp3 content is indicative of the diamond-like content of the material. In one non-limiting configuration, the sp2 content of the film material is greater than the sp3 content. Another aspect for characterizing the DLC material is referred to as micro-Raman. Micro-Raman provides a 'G' peak and a 'D' peak, which refer to disorder and graphite respectively. The diamond-like carbon coating 80 film for use in the present disclosure can have a I(D)/I(G) peak ratio of < or =1.0 based on micro-Raman analysis.

In another non-limiting configuration, the diamond-like carbon coating 80 can be doped with carbide-forming metals to improve wear resistance of the film. Such carbide-forming metals can include tungsten or silicon or combinations thereof, and these metals help to form carbides in the film which increase wear resistance. In some instances, the carbide-forming metal can also or in addition be chromium or molybdenum or combinations thereof, which can also assist in the formation of carbides.

It should be appreciated that the diamond-like carbon coating 80 in accordance with the present disclosure produces a low friction and wear-resistant carbon-based seal interface which, for example, can operate effectively between 200 and 350° F., under elevated sliding velocities. This, in turn, can reduce sub-surface heating (for example due to frictional heating) by reducing the friction co-efficient and improving the break-in phase, which will consequently improve long term wear resistance of the carbon seal 64.

The diamond-like carbon coating 80 creates a carbon-carbon interface with low friction from the beginning of operation, and therefore produces a very short break-in phase. During initial operation, a transfer film or graphitic material 92 is formed over the diamond-like carbon coating 80, and this configuration remains through steady state operation of the carbon seal 64. The carbon seal 64 can also include film controllers to reduce the generation of excess graphitic material 92.

During operation of the seal assembly 60 in the gas turbine engine 20, the outer shaft 50 rotates relative to the carbon seal 64. Without the coatings 78, 80, the carbon seal 64 is in direct contact with the radially outer surface 69 of the outer shaft 50 which causes wear on a radially inner portion of the carbon seal 64 including the projection 86. One feature of the coatings 78 and 80 is a reduction in friction between the carbon seal 64 and the outer shaft 50 as described above.

The reduction in friction is a result of a carbon on carbon interface between the diamond-like carbon coating 80 and the carbon seal 64 and a formation of the graphitic material 92 between the diamond-like carbon coating 80 and the carbon seal 64. The graphitic material 92 reduces frictional forces between the diamond-like carbon coating 80 and the carbon seal 64 to reduce wear on the radially inner portion of the carbon seal 64. Although the illustrated example shows the graphitic material 92 located between a portion of the diamond-like carbon coating 80 and the carbon seal 64, the graphitic material 92 can form in a majority of the contact area between diamond-like carbon coating 80 and carbon seal 64.

The foregoing description shall be interpreted as illustrative and not in any limiting sense. A worker of ordinary skill in the art would understand that certain modifications could come within the scope of this disclosure. For these reasons, the following claim should be studied to determine the true scope and content of this disclosure.

What is claimed is:

1. A seal assembly comprising:
   a housing at least partially defining a seal opening and at least partially surrounding a rotatable shaft; and
   a carbon seal located at least partially in the seal opening and including a sealing surface wherein the housing forms a circumferential ring and the carbon seal is formed from circumferential segments each including a groove on a radially outer surface with a garter spring located in a corresponding groove of each the circumferential segments;
   wherein the rotatable shaft includes a radially facing surface having a carbide based coating and a diamond-like carbon coating in engagement with the sealing surface on the carbon seal.

2. The assembly of claim 1, wherein the carbide based coating is in direct contact with a radially outer surface of the rotatable shaft.

3. The assembly of claim 2, wherein the diamond-like carbon coating is in direct contact with the carbide based coating and the carbon seal.

4. The assembly of claim 1, wherein the carbide based coating and the diamond-like carbon coating extend circumferentially around the rotatable shaft.

5. The assembly of claim 1, wherein the carbide based coating and the diamond-like carbon coating create a radial separation between the rotatable shaft and the carbon seal.

6. The assembly of claim 1, wherein the carbon seal includes an electrocarbon grade carbon and the rotatable shaft is a spool for a gas turbine engine.

7. The assembly of claim 1, wherein the diamond-like carbon coating is silicon doped.

8. The assembly of claim 1, wherein the carbide based coating and the diamond-like carbon coating separate the rotatable shaft from contacting the carbon seal.

9. The assembly of claim 1, further comprising a recess in the rotatable shaft for accepting the carbide based coating and the diamond-like carbon coating.

10. The assembly of claim 9, wherein the sealing surface is located on a radially inner side of a projection of the carbon seal.

11. The assembly of claim 9, wherein the carbon seal includes a first axial dimension and the sealing surface includes a second axial dimension less than the first axial dimension, wherein the sealing surface is a radially innermost surface of the carbon seal.

12. The assembly of claim 1, wherein the carbide based coating is between 76 and 152 micrometers thick.

13. The assembly of claim 1, wherein the diamond-like carbon coating is approximately 1 micrometer thick.

14. A seal assembly comprising:
a housing at least partially defining a seal opening and at least partially surrounding a rotatable shaft;
a carbon seal located at least partially in the seal opening and including a sealing surface, wherein the rotatable shaft includes a radially facing surface having a carbide based coating and a diamond-like carbon coating in engagement with the sealing surface on the carbon seal; and
a recess in the rotatable shaft for accepting the carbide based coating and the diamond-like carbon coating; wherein the carbon seal includes a first axial dimension and the sealing surface includes a second axial dimension less than the first axial dimension, wherein the sealing surface is a radially innermost surface of the carbon seal.

15. A method of using a seal assembly, the method comprising:
locating a carbon seal adjacent a rotatable shaft, wherein the carbon seal includes a first axial dimension and a sealing surface in engagement with the rotatable shaft includes a second axial dimension that is less than the first axial dimension, wherein the sealing surface is a radially innermost surface of the carbon seal;
separating the carbon seal from the rotatable shaft with a carbide based coating and a diamond-like carbon coating; and
generating a lubricant between the carbon seal and the diamond-like carbon coating.

16. The method of claim 15, wherein generating the lubricant includes forming a graphitic material between an interface of the carbon seal and the diamond-like carbon coating.

17. The method of claim 15, further comprising rotating a shaft adjacent the carbon seal and the shaft includes a velocity of at least 152 m/s relative to the carbon seal and the shaft is a spool for a gas turbine engine.

18. The method of claim 15, wherein the carbide based coating is applied through at least one of a high velocity oxygen fuel coating process or an APS coating process.

19. The method of claim 15, wherein the diamond-like carbon coating is applied through at least one of a PVD or CVD process.

20. The method of claim 15, including compressing multiple circumferential segments of the carbon seal with a garter spring located in a groove on a radially outer side of each of the multiple circumferential segments.

* * * * *